United States Patent
Itoh et al.

(10) Patent No.: US 11,322,912 B2
(45) Date of Patent: May 3, 2022

(54) SEMICONDUCTOR LASER ARRAY, SEMICONDUCTOR LASER ELEMENT, SEMICONDUCTOR LASER MODULE, AND WAVELENGTH-VARIABLE LASER ASSEMBLY

(71) Applicant: FURUKAWA ELECTRIC CO., LTD., Tokyo (JP)

(72) Inventors: Akira Itoh, Tokyo (JP); Junji Yoshida, Tokyo (JP); Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/188,270

(22) Filed: Jun. 21, 2016

(65) Prior Publication Data

US 2016/0301193 A1 Oct. 13, 2016

Related U.S. Application Data (63) Continuation of application No. PCT/JP2014/084697, filed on Dec. 26, 2014.
(Continued)

(51) Int. Cl.
*H01S 5/34* (2006.01)
*H01S 5/40* (2006.01)
(Continued)

(52) U.S. Cl.
CPC .......... *H01S 5/4012* (2013.01); *H01S 5/0265* (2013.01); *H01S 5/02251* (2021.01);
(Continued)

(58) Field of Classification Search
CPC ..... H01S 5/4012; H01S 5/4087; H01S 5/2031
See application file for complete search history.

(56) References Cited

U.S. PATENT DOCUMENTS 6,167,073 A * 12/2000 Botez ............... B82Y 20/00
372/45.01
6,555,403 B1 4/2003 Domen et al.
(Continued)

FOREIGN PATENT DOCUMENTS

CN 1773791 A 5/2006
CN 102474069 A 5/2012
(Continued)

OTHER PUBLICATIONS

International Search Report dated Mar. 31, 2015 in PCT/JP2014/084697, filed on Dec. 26, 2014 ( with English Translation).
(Continued)

*Primary Examiner* — Tod T Van Roy
(74) *Attorney, Agent, or Firm* — Oblon, McClelland, Maier & Neustadt, L.L.P.

(57) ABSTRACT

A semiconductor laser array includes: a plurality of semiconductor lasers configured to oscillate in a single mode at oscillation wavelengths different from one another, each semiconductor laser including an active layer including a multi-quantum well structure including a plurality of will layers and a plurality of barrier layers laminated alternately, and an n-side separate confinement heterostructure layer and p-side separate confinement heterostructure layer configured to sandwich the active layer therebetween in a thickness direction, band gap energies of the n-side separate confinement heterostructure layer and the p-side separate confinement heterostructure layer being greater than band gap energies of the barrier layers of the active layer. The active layer is doped with an n-type impurity.

11 Claims, 5 Drawing Sheets

Related U.S. Application Data (60) Provisional application No. 61/920,947, filed on Dec. 26, 2013.

(51) Int. Cl.
    *H01S 5/12*     (2021.01)
    *H01S 5/024*     (2006.01)
    *H01S 5/0687*     (2006.01)
    *H01S 5/30*     (2006.01)
    *H01S 5/02251*     (2021.01)
    *H01S 5/20*     (2006.01)
    *H01S 5/026*     (2006.01)
    *H01S 5/227*     (2006.01)
    *H01S 5/22*     (2006.01)
    *H01S 5/10*     (2021.01)

(52) U.S. Cl.
    CPC ........ *H01S 5/02415* (2013.01); *H01S 5/0687* (2013.01); *H01S 5/12* (2013.01); *H01S 5/2031* (2013.01); *H01S 5/3086* (2013.01); *H01S 5/3409* (2013.01); *H01S 5/1039* (2013.01); *H01S 5/2206* (2013.01); *H01S 5/227* (2013.01); *H01S 5/4087* (2013.01)

(56) References Cited

U.S. PATENT DOCUMENTS

| | | | |
|---|---|---|---|
| 8,816,319 B1* | 8/2014 | Raring | ................ H01S 5/3403 257/9 |
| 2001/0006529 A1 | 7/2001 | Komori et al. | |
| 2002/0041613 A1 | 4/2002 | Yoshida et al. | |
| 2003/0043878 A1* | 3/2003 | Funabashi | ................ H01S 5/12 372/96 |
| 2009/0080484 A1* | 3/2009 | Shigihara | ............... H01S 5/2031 372/46.01 |
| 2012/0128375 A1* | 5/2012 | Kimoto | .............. G02B 6/12004 398/201 |
| 2013/0315273 A1 | 11/2013 | Kimoto et al. | |
| 2015/0103858 A1 | 4/2015 | Yoshida et al. | |

FOREIGN PATENT DOCUMENTS

| | | |
|---|---|---|
| JP | 3-288806 | 12/1991 |
| JP | 11-340580 | 12/1999 |
| JP | 2001-127377 | 5/2001 |
| JP | 2001-189529 | 7/2001 |
| JP | 2002-299768 | 10/2002 |
| JP | 2002-368341 | 12/2002 |
| JP | 2004-349692 | 12/2004 |
| JP | 2005-39297 | 2/2005 |
| JP | 2005-191349 | 7/2005 |
| JP | 2013-102003 | 5/2013 |
| WO | WO 2013/151145 | 10/2013 |

OTHER PUBLICATIONS

Written Opinion dated Mar. 31, 2015 in PCT/JP2014/084697, filed on Dec. 26, 2014.

Japanese Office Action dated Apr. 7, 2020 in corresponding Japanese Patent Application No. 2019-038883, with English translation, (8 pages).

* cited by examiner

SEMICONDUCTOR LASER ARRAY, SEMICONDUCTOR LASER ELEMENT, SEMICONDUCTOR LASER MODULE, AND WAVELENGTH-VARIABLE LASER ASSEMBLY

CROSS-REFERENCE TO RELATED APPLICATION

This application is a continuation of PCT International Application No. PCT/JP2014/084697 filed on Dec. 26, 2014 which claims the benefit of priority from U.S. Provisional Patent Application 61/920,947 filed on Dec. 26, 2013, the entire contents of which are incorporated herein by reference.

BACKGROUND

1. Field of the Disclosure

The present disclosure relates to a semiconductor laser array, a semiconductor laser element, a semiconductor laser module, and a wavelength-variable laser assembly.

2. Description of the Related Art

As a wavelength-tunable light source for use in dense wavelength division multiplexing (DWDM) optical communication, semiconductor laser arrays in which a plurality of semiconductor lasers having different laser oscillation wavelengths with each other are integrated are disclosed (for example, see Japanese Patent Application Laid-open Publication No. 2004-349692). The semiconductor laser array of this kind is used for a semiconductor laser element serving as a wavelength-variable laser in which operating semiconductor lasers are switched to change a wavelength of an output laser light.

The semiconductor laser element includes a configuration in which a semiconductor laser array, an optical waveguide array, an optical coupler, and a semiconductor optical amplifier (SOA) are connected in this order. In the semiconductor laser element, a laser light from the operating semiconductor laser is subjected to optical amplification by the SOA after being transmitted through the optical coupler, and then is outputted from an output end of the element.

The semiconductor laser element as such is used by mounting it in a semiconductor laser module with, for example, a pig tail fiber.

Moreover, the semiconductor laser module as such is used as a wavelength-variable laser assembly which is combined with an external modulator and as a signal light source for a long distance optical transmission, for example, in a DWDM optical communication network system.

Herein, as a signal light source or a local light source for use in digital coherent transmission having transmission rates of 40, 100, and 400 Gbps, a wavelength-variable laser capable of outputting a highly intense laser light at a wide bandwidth is necessary.

For example, as a common example, for a light source used in 100 Gbps transmission by the dual polarization quadrature phase shift keying (DP-QPSK) method, it is needed that an intensity of a light outputted from the pig tail fiber of the semiconductor laser module is equal to or greater than 40 mW and a spectrum linewidth is equal to or less than 500 kHz. In another example of 400 Gbps transmission by the quadrature amplitude modulation (DP-16QAM) method, it is needed that the intensity of a light outputted from the pig tail fiber of the semiconductor laser module is equal to or greater than 40 mW and the spectrum linewidth is equal to or less than 100 kHz.

There is a need for a semiconductor laser array, a semiconductor laser element, a semiconductor laser module, and a wavelength-variable laser assembly which are capable of outputting a highly intense laser light at a wide bandwidth.

SUMMARY

A semiconductor laser array according to one aspect of the present disclosure includes: a plurality of semiconductor lasers configured to oscillate in a single mode at oscillation wavelengths different from one another, each semiconductor laser including an active layer including a multi-quantum well structure including a plurality of well layers and a plurality of barrier layers laminated alternately, and an n-side separate confinement heterostructure layer and p-side separate confinement heterostructure layer configured to sandwich the active layer therebetween in a thickness direction, band gap energies of the n-side separate confinement heterostructure layer and the p-side separate confinement heterostructure layer being greater than band gap energies of the barrier layers of the active layer, and the active layer is doped with an n-type impurity.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Hereafter, Embodiments of a semiconductor laser array, a semiconductor laser element, a semiconductor laser module, and a wavelength-variable laser assembly according to the present disclosure will be explained with reference to the drawings. The present disclosure is not limited to the Embodiments. In all the drawings, identical or corresponding elements are given same reference numerals appropriately. Moreover, it should be noted that the drawings show schematic examples. Accordingly, a relationship between respective elements may be different from real values. Among the drawings, there may be parts where the relationships and ratios of the shown sizes are different from one another.

First Embodiment

Figure 1:
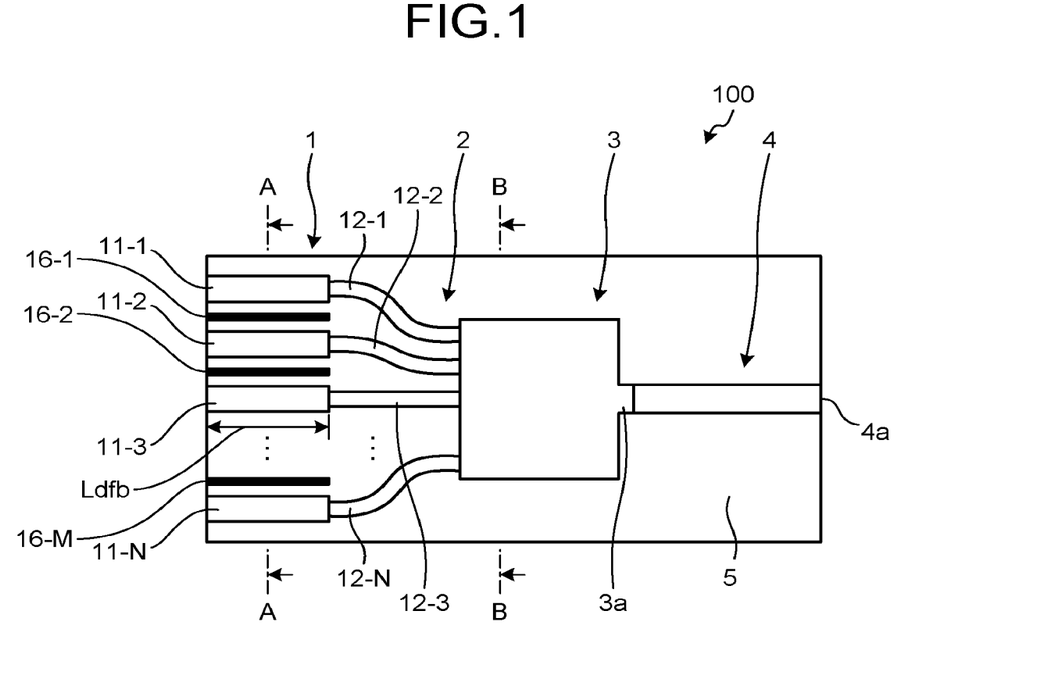
FIG. 1 is a schematic plan view of a semiconductor laser array and a semiconductor laser element according to a first embodiment of the present disclosure.

To start with, a semiconductor laser array and a semiconductor laser element according to a first embodiment will be explained. FIG. 1 is a schematic plan view of the semiconductor laser array and the semiconductor laser element according to the first embodiment. As shown in FIG. 1, a semiconductor laser array 1 is a semiconductor laser array having distributed feedback (DFB) lasers 11-1 to 11-N as a plurality of semiconductor lasers (N is an integer). A semiconductor laser element 100 is a semiconductor laser element including: the semiconductor laser array 1; an optical waveguide array 2 to which a light outputted from each DFB laser of the semiconductor laser array 1 is inputted; an optical coupler 3 multiplexing and outputting the lights inputted from the optical waveguide array 2; and an SOA 4 as a semiconductor optical amplifier amplifying the light outputted from the optical coupler 3. In the semiconductor laser element 100, those are integrated on a semiconductor substrate and buried in a buried portion 5 to form a mesa structure.

In the beginning, a configuration of the semiconductor laser array 1 will be explained in detail. Each of DFB lasers 11-1 to 11-N is an edge-emitting laser having a striped and buried structure of which width is, for example, 1.5 μm to 3 μm, and is formed with, for example, 25 μm pitch in a width direction. As shown in FIG. 1, when cavity length Ldfb indicates length of each of DFB lasers 11-1 to 11-N, the cavity length Ldfb is, for example, equal to or greater than 1200 μm and equal to or smaller than 1500 μm. Moreover, trench grooves 16-1 to 16-M (M=N−1) are provided in the buried portion 5 among the DFB lasers 11-1 to 11-N.

Each of the DFB lasers 11-1 to 11-N has a diffraction grating having a period corresponding to an oscillation wavelength of each DFB laser. The DFB lasers 11-1 to 11-N are configured so that output lights become laser lights in single mode oscillations by differentiating the periods of the diffraction gratings provided to the respective DFB lasers from one another, and that their laser oscillation wavelengths differ within a range of approximately 1530 nm to 1570 nm. Each of the oscillation wavelengths of the DFB lasers 11-1 to 11-N may be fine-tuned by varying temperatures set for the semiconductor laser array 1. That is, the semiconductor laser array 1 achieves a wide wavelength-tunable range by switching the DFB lasers to be driven and by temperature control.

It is preferable that the range of fine-tuning the respective laser oscillation wavelengths of the DFB lasers 11-1 to 11-N by the temperature control be equal to or smaller than approximately 3 nm. Therefore, in order to cover a wavelength range of approximately 1530 nm to 1570 nm, it is preferable that the number of the DFB lasers 11-1 to 11-N be equal to or greater than 12, for example, 16. However, N is not limited to a specific value. The range of the oscillation wavelengths of the DFB lasers 11-1 to 11-N, not being limited specifically, may be, for example, approximately 1570 nm to 1610 nm.

Figure 2:
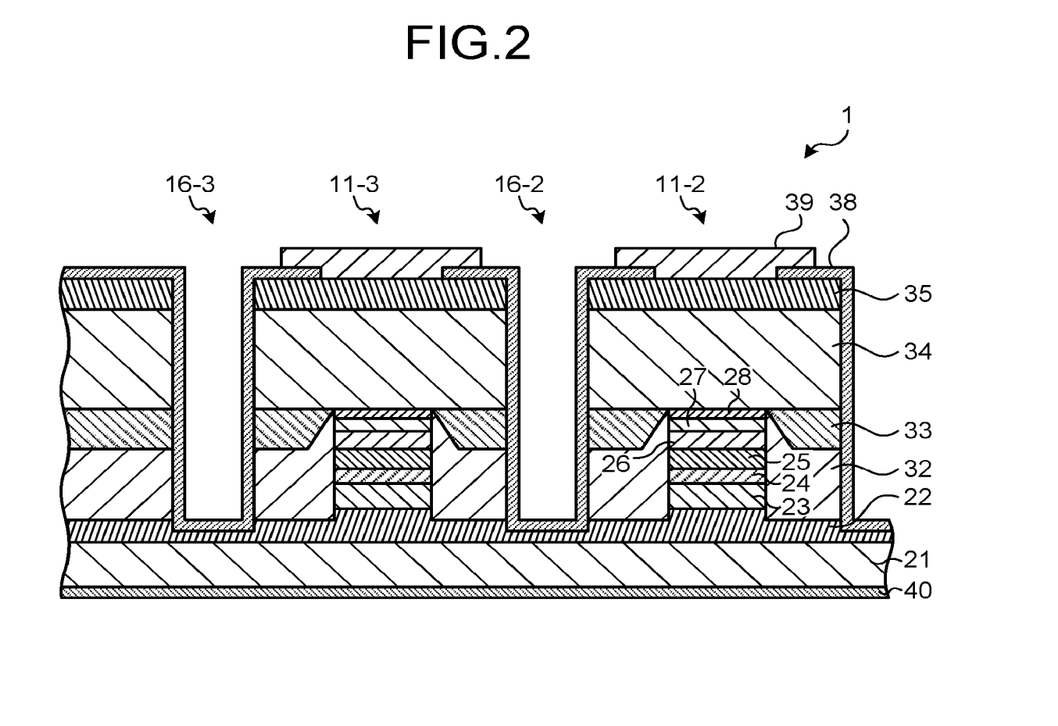
FIG. 2 is a view showing a part of a cross section of the semiconductor laser array according to the first embodiment of the present disclosure.

FIG. 2 is a view showing a part of a cross section of the semiconductor laser array according to the first embodiment of the present disclosure. That is, FIG. 2 is a view showing a part of cross-sectional view taken from line A-A of FIG. 1. As shown in FIG. 2, for example, the DFB laser 11-2 includes an n-type InP buffer layer 22 serving as a lower cladding as well, an n-side separate confinement heterostructure (SCH) layer 23 made of InGaAsP, an active layer 24 being of multi-quantum well (MQW) structure, a p-type SCH layer 25 made of InGaAsP, an InP spacer layer 26, a grating layer 27 made of InGaAsP or AlGaInAs, and a p-type InP layer 28 laminated on an n-type InP substrate 21 in this order. A diffraction grating is formed in the grating layer 27.

The layers from the p-type InP layer 28 to a portion of the n-type InP buffer layer 22 have a striped mesa structure. This mesa structure is buried by a p-type InP buried layer 32 and an n-type InP electric-current-blocking layer 33. A p-type InP cladding layer 34 and an InGaAs contact layer 35 are laminated in this order on the p-type InP layer 28 and the n-type InP electric-current-blocking layer 33. Outside surfaces of each semiconductor layers are protected by an SiN protection layer 38. The SiN protection layer 38 has an opening portion at a part on the InGaAs contact layer 35. A p-side electrode 39 is formed to the opening portion. An n-side electrode 40 is formed on a back surface of the n-type InP substrate 21.

The active layer 24 has a plurality of well layers and barrier layers laminated alternately. The well layers and the barrier layers are made of InGaAsP semiconductor material or AlGaInAs semiconductor material. It is preferable that the active layer 24 be of a compression strain quantum well structure of which lattice-mismatched system is positive relative to the substrate. However, the barrier layers may be of a strain compensation structure which introduces a tensile strain quantum well of which lattice-mismatched degree is negative.

Composition of the active layer 24 is set to have a wavelength being a bandwidth corresponding to oscillation wavelengths of the DFB lasers 11-1 to 11-N and an optical amplification of the SOA 4, for example, in the vicinity of the center of 1530 nm to 1570 nm, that is, at a gain peak in the vicinity of 1550 nm. Wavelengths at gain peaks of the semiconductor laser and the SOA obtained by this setting of the composition are optimized based on an operating temperature range of elements.

The well layers and the barrier layers of the active layer 24 are uniformly doped with S atoms that are n-type impurities. As n-type impurities other than the S atoms, Se and Si may be used. A purpose of doping with impurities is to prevent increase in absorption loss of a light caused by p-type impurities dispersed in the active layer by heat in a thermal process in a laser-manufacturing step. It is preferable that doping concentration of the n-type impurities be equal to or greater than $1 \times 10^{17}$ cm$^{-3}$ and equal to or smaller than $3 \times 10^{18}$ cm$^{-3}$. If the doping concentration is equal to or lower than $1 \times 10^{17}$ cm$^{-3}$, the above-described doping effect may not be obtained, and thus, an attempt of obtaining higher optical power is insufficient, and if the doping concentration is equal to or higher than $3 \times 10^{18}$ cm$^{-3}$, crystallinity of the active layer 24 is deteriorated, a non-luminescent component increases, and thus, a high optical output operation is hindered and achieving reliability becomes difficult.

A width of the active layer 24 is, for example, equal to or greater than 1.4 µm and equal to or smaller than 1.7 µm. The other DFB lasers 11-1, and 11-3 to 11-N have structures that are approximately the same as that of the DFB laser 11-2 including composition and thickness of the active layer 24.

The n-side SCH layer 23 and the p-type SCH layer 25 are formed to sandwich the active layer 24 in the thickness direction and have a graded index (GRIN)-SCH structure in which composition is varied gradually so that a band gap energy thereof increases more than that of the barrier layer of the active layer 24.

Figure 3:
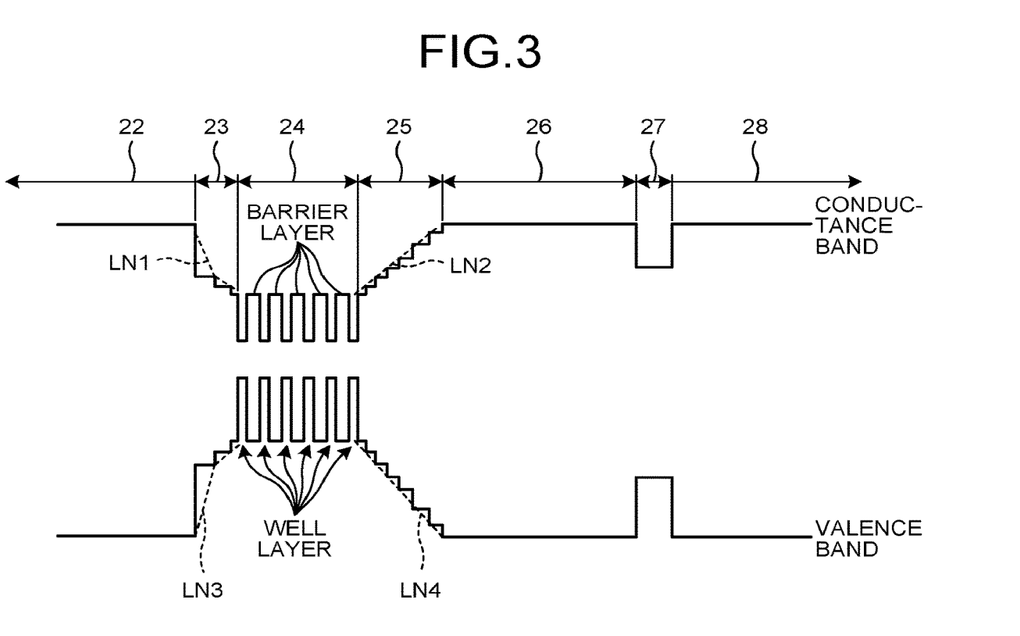
FIG. 3 is a view showing an energy band diagram around an active layer of the semiconductor laser array shown in FIG. 1.

FIG. 3 is a view showing an energy band diagram around the active layer of the semiconductor laser array shown in FIG. 1. As shown in FIG. 3, in the n-side SCH layer 23, three steps of SCH structure are formed by an InGaAsP bulk of which composition wavelengths differ. The n-side SCH layer 23 forms a band diagram in which variation ratio of the band gap energy increases along with an increase in distances of a broken line LN 1 and a broken line LN 3 from the active layer 24. In order to improve an injection efficiency for a hole, the band gap energy of the n-side SCH layer 23 may not have to be disposed linearly and may be configured so that the band gap energy increases along with the increases in the distances of the broken line LN 1 being convex upward and the broken line LN 3 being convex downward from the active layer 24.

By contrast, the p-type SCH layer 25 is thicker than the n-side SCH layer 23. In the p-type SCH layer 25, seven steps of SCH structure are formed by an InGaAsP bulk of which composition wavelengths differ. The thickness of the p-type SCH layer 25 is set so that the band gap of each layer is disposed linearly as shown by a broken line LN 2 and a broken line LN 4.

This is for a purpose of achieving a linear SCH structure simulatively and increasing an efficiency for injecting a carrier, particularly an electron, to the active layer 24. The band gap energy of the p-type SCH layer 25 may not have to be disposed linearly and may be configured so that the band gap energy increases along with the increases in the distances of the broken line LN 2 being convex upward and the broken line LN 4 being convex downward from the active layer 24.

The p-type SCH layer 25 in this state has effects of restraining an electron from overflowing and improving efficiency for injecting a carrier to the active layer 24.

If a stricter component control is possible and a lattice-matched state may be achieved, a linear SCH structure may be used in which a Group-III atom and a group-V atom of the InGaAsP configuring the SCH layer vary continuously.

It is preferable that the n-side SCH layer 23 be multi-stepped for improving the carrier injection efficiency, and the n-side SCH layer 23 may be of a structure similar to that of the p-type SCH layer 25. However, it is preferable that, for restraining an influence such as crystal defect or the like by the multi-stepped configuration, the n-side SCH layer 23 be of, for example, two to three steps of the SCH structure. On the other hand, in order to maintain crystal quality without conducting a complex composition control for improving the carrier injection efficiency with a simple structure, it is preferable that the p-type SCH layer 25 be multi-stepped, for example, six to seven steps of the SCH structure are preferable.

Since the n-side SCH layer 23 and the p-type SCH layer 25 differ in structure, and since the band gap energies of the n-side SCH layer 23 and the p-type SCH layer 25 are asymmetric across the active layer 24, a DFB laser having desirable characteristics may be designed.

Hereafter, a configuration of the semiconductor laser element 100 will be explained in detail. Referring back to FIG. 1, the optical waveguide array 2 has N pieces of optical waveguides 12-1 to 12-N to which lights being outputted from the DFB lasers 11-1 to 11-N of the semiconductor laser array 1 are inputted respectively. The optical waveguides 12-1 to 12-N are formed between the semiconductor laser array 1 and the optical coupler 3 and have a buried mesa structure, which will be explained later, similar to that of the optical coupler 3. The optical waveguides 12-1 to 12-N connect each DFB laser of the semiconductor laser array 1 and N pieces of input ports of the optical coupler 3 optically.

Figure 4:
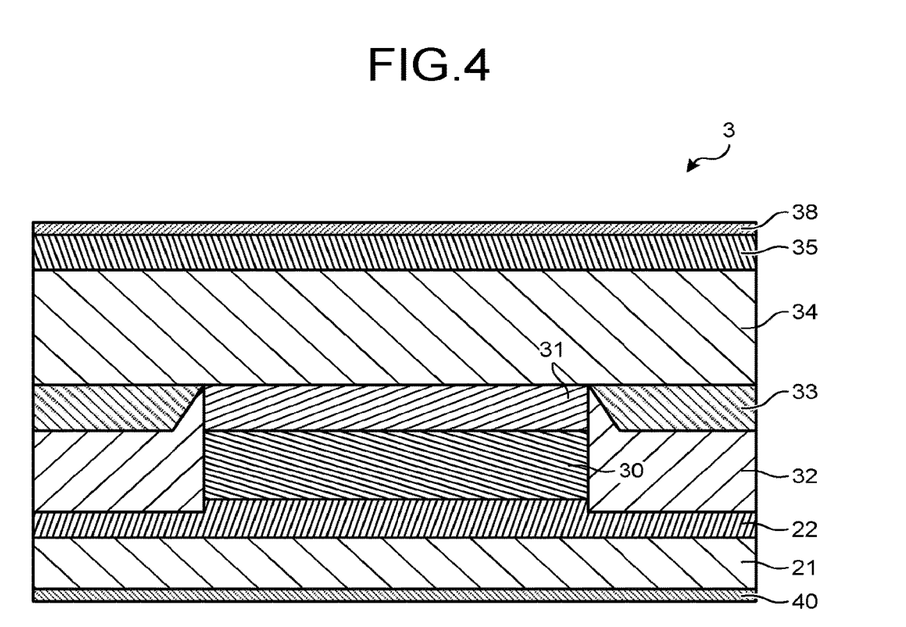
FIG. 4 is a cross-sectional view of an optical coupler of the semiconductor laser element shown in FIG. 1.

The optical coupler 3 is a multi-mode interferometer (MMI) type optical coupler having N pieces of the input ports and one output port. FIG. 4 is a cross-sectional view of an optical coupler of the semiconductor laser element shown in FIG. 1. That is, FIG. 4 is a view showing a cross-sectional view taken from line B-B in FIG. 1. As shown in FIG. 4, although the optical coupler 3 has a buried mesa structure similar to that of each DFB laser of the semiconductor laser array 1, being of a structure in which the laminated structure from the n-side SCH layer 23 to the p-type InP layer 28 is replaced with a laminated structure of an InGaAsP core layer 30 and an I type InP layer 31. A mesa width of the optical coupler 3 is formed to be broader than that of each DFB laser of the semiconductor laser array 1. In the optical coupler 3, the opening portion and the p-side electrode 39 of the SiN protection layer 38 are not formed.

The optical coupler 3 is not limited to the MMI-type optical coupler and may be other N×1 optical coupler, for example, a Fresnel coupler.

The SOA 4 is connected to an output port 3a of the optical coupler 3. The SOA 4 has a buried mesa structure similar to that of each DFB laser of the semiconductor laser array 1. However, unlike the DFB laser, the SOA 4 does not have the grating layer 27, and instead the p-type InP layer is formed. Although the structures of the active layers of each DFB laser and the SOA 4 of the semiconductor laser array 1 were applied as the same structure from a view point of efficiency in manufacturing process, different structures may be used. The width of the active layer, for example, being equal to or greater than 1.4 µm and equal to or smaller than 1.7 pm in the SOA 4 as well, is not limited specifically as long as it is a width capable of guiding a laser light being outputted by the semiconductor laser array 1 in a single mode.

Hereafter operations of the semiconductor laser array 1 and the semiconductor laser element 100 will be explained. One selected from the DFB lasers 11-1 to 11-N of the semiconductor laser array 1 is driven to output a single mode laser light at a desirable wavelength. Since the trench grooves 16-1 to 16-M separate the DFB lasers 11-1 to 11-N electrically, separation resistances among the DFB lasers increase, and thus, it is possible to select, and drive one of the DFB lasers 11-1 to 11-N easily.

One, connected optically to the driven DFB laser, of the plurality of the optical waveguides 12-1 to 12-N guides the laser light from the DFB laser in a single mode. The optical coupler 3 causes the laser light guided in the optical waveguide to be transmitted therethrough and to be outputted from the output port 3a. The SOA 4 amplifies the laser light being inputted from the output port 3a and outputs the laser light from an output end 4a to outside the semiconductor laser element 100. Herein the SOA 4 is used for compensating for optical loss, caused by the optical coupler 3, of the laser light from the semiconductor laser array 1 and obtaining a desirable intensity of optical power from the output end 4a. When the optical coupler 3 has N pieces of input ports and one output port, the intensity of the laser light from the semiconductor laser array 1 is attenuated to approximately 1/N by the optical coupler 3.

Second Embodiment

Figure 5:
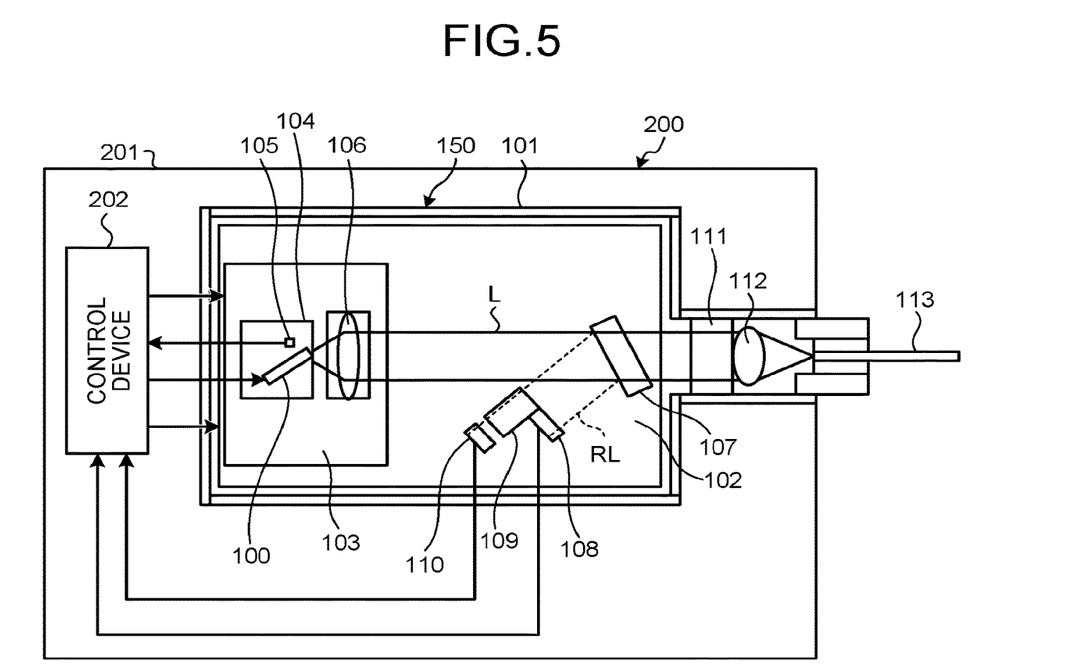
FIG. 5 is a schematic plan view of a semiconductor laser module and a wavelength-variable laser assembly according to a second embodiment of the present disclosure.

Hereafter, a semiconductor laser module and a wavelength-variable laser assembly according to a second embodiment will be explained. FIG. 5 is a schematic plan view of a semiconductor laser module and a wavelength-variable laser assembly according to the second embodiment of the present disclosure. As shown in FIG. 5, a semiconductor laser module 150 is a semiconductor laser module using the semiconductor laser element 100 according to the first embodiment, and a wavelength-variable laser assembly 200 is a wavelength-variable laser assembly using this semiconductor laser module 150.

The semiconductor laser module 150 includes a Peltier element 102 contained in an enclosure 101, a Peltier element 103 mounted on the Peltier element 102, the semiconductor laser element 100 and a thermistor 105 mounted on the Peltier element 103 via a sub-mount 104, a collimator lens 106 mounted on the Peltier element 103, a beam splitter 107, a photo-diode 108, an etalon filter 109, a photo-diode 110, an optical isolator 111 contained in a protrusion portion of the enclosure 101, a light-condensing lens 112 as an optical component, and an optical fiber 113. The beam splitter 107, the photo-diode 108, the etalon filter 109, and the photo-diode 110 are mounted on the Peltier element 102.

The wavelength-variable laser assembly 200 includes the semiconductor laser module 150 implemented on an electronic substrate 201 and a control device 202 controlling and driving the semiconductor laser module 150.

Hereafter, configurations of the semiconductor laser module 150 and the wavelength-variable laser assembly 200 will be explained in detail. Although the semiconductor laser element 100 may be of a configuration that is the same as the configuration explained in the first embodiment, a bending waveguide is connected to the output end 4a of the SOA 4. The semiconductor laser element 100 outputs a laser light L at a predetermined wavelength and at a predetermined optical intensity in a single mode oscillation.

The thermistor 105 is disposed in the vicinity of the semiconductor laser element 100 and used for monitoring a temperature of the semiconductor laser element 100. The collimator lens 106 causes the laser light L outputted by the semiconductor laser element 100 to be a collimated light. The beam splitter 107, while transmitting a major portion (for example, equal to or greater than 90%) of the laser light L therethrough, reflects a portion of the light as a reflected light RL. The photo-diode 108 disposed to block a part of an optical path of the reflected light RL receives a portion of the reflected light RL and outputs an electric current corresponding to its light-receiving amount. The etalon filter 109 has transmission wavelength characteristics varying periodically relative to wavelength and causes the reflected light RL not blocked by the photo-diode 108 to be transmitted therethrough at a permeability corresponding to its wavelength. The photo-diode 110 receives the reflected light RL transmitting through the etalon filter 109 and outputs an electric current corresponding to its light-receiving amount. The photo-diode 108 is used for monitoring an intensity of the laser light L. The etalon filter 109 and the photo-diode 110 are used for monitoring a wavelength of the laser light L.

The optical isolator 111, while transmitting therethrough the laser light L transmitting through the beam splitter 107, blocks a light returning from the optical fiber 113's side to the semiconductor laser element 100. The light-condensing lens 112 causes the laser light L transmitting through the optical isolator 111 to be coupled to the optical fiber 113. The optical fiber 113 is a pig tail fiber guiding and outputting the laser light L to outside the semiconductor laser module 150.

The Peltier element 102 is used for cooling the semiconductor laser element 100 and for adjusting a temperature of the etalon filter 109. The Peltier element 103 is used for adjusting a temperature of the semiconductor laser element 100. The control device 202 measures an electric resistance value of the thermistor 105 via a wiring provided on the electronic substrate 201, receives electric currents from the photo-diode 108 and the photo-diode 110, and supplies driving currents to the Peltier element 102, the Peltier element 103, and the semiconductor laser element 100.

Hereafter, operations of the semiconductor laser module 150 and the wavelength-variable laser assembly 200 will be explained. At the beginning, one, which is to be driven, of the plurality of the DFB lasers of the semiconductor laser element 100 is selected based on a wavelength and an optical intensity of the laser light L to be outputted, and then, a temperature and a driving current for the selected DFB laser and a driving current for the SOA 4 of the semiconductor laser element 100 are determined. These selection and determination may be conducted based on a table showing a relationship between the temperature and the driving current of each DFB laser and the SOA 4 stored in the control device 202 based on a command from outside.

Then, the control device 202 supplies driving currents to the Peltier element 102 and the Peltier element 103 based on the temperature and the driving current determined for the DFB laser and the driving current determined for the SOA 4 to adjust the temperature of the selected DFB laser, and supplies driving currents to the selected DFB laser and the SOA 4. Upon being supplied the driving current, the DFB laser outputs the laser light L at the desirable wavelength.

The laser light L is inputted to the SOA 4 via the optical waveguide array 2 and the optical coupler 3, amplified by the SOA 4, and then inputted to the bending waveguide. The bending waveguide causes the amplified laser light L to be inclined and outputted by approximately seven degrees relative to an emitting-end surface. It is desirable that the inclination angle of the laser light L relative to the emitting-end surface be adjusted within a range of 6 to 12 degrees. Hereby it is possible to decrease amount of the light, of the laser light L, reflected at the emitting-end surface and returned to the DFB laser's side.

The laser light L outputted by the semiconductor laser element 100 passes through the collimator lens 106, the beam splitter 107, the optical isolator 111, and the light-condensing lens 112 in this order to be coupled to the optical fiber 113, and then, the laser light L is outputted to outside the semiconductor laser module 150.

The control device 202 conducts a feedback control so that the optical intensity and the wavelength of the laser light L become constant by adjusting the driving currents for the Peltier element 102, the Peltier element 103, the selected DFB laser, and the SOA 4 based on the temperature of the semiconductor laser element 100 monitored by the thermistor 105 and the optical intensity and the wavelength of the laser light L monitored by the photo-diode 108, the photo-diode 110, and the etalon filter 109.

Examples

Hereafter, as Examples, results of measuring various characteristics are shown for the semiconductor laser array 1 and the semiconductor laser element 100 according to the first embodiment and the semiconductor laser module 150 and the wavelength-variable laser assembly 200 according to the second embodiment. More specifically, DFB lasers having structures, shown in Table 1, of Example 1-1 and Example 1-2 (Examples 1), Example 2, and Comparison Example, and a device using this DFB laser are produced, and characteristics were compared.

TABLE 1

|  | Comparison example | Example 1-1 | Example 1-2 | Example 2 |
|---|---|---|---|---|
| Doping to active layer | None | n-type (S) | | n-type (S) |
| Doping concentration (cm$^{-3}$) | 0 | $6 \times 10^{17}$ | $1.2 \times 10^{18}$ | $6 \times 10^{17}$ |
| SCH structure  p-side | Three steps | Seven steps | | Seven steps |
| n-side | Three steps | Three steps | | Three steps |
| Number of wells | 6 | 6 | | 5 |
| Optical confinement coefficient (%) <calculation value> | 5 | 4.9 | | 3.7 |
| Far-field pattern in vertical direction (°) <calculation value> | 28.3 | 27.2 | | 24.6 |
| Far-field pattern in horizontal direction (°) <calculation value> | 22.9 | 21.9 | | 19.2 |
| Ratio of far-field patterns (vertical/horizontal) | 1.23 | 1.24 | | 1.28 |
| Thickness of InP spacer layer (nm) | 155 | 140 | | 140 |
| Thickness of grating layer (nm) | 20 | 25 | | 25 |

Table 1 shows a characteristic element's structure of the DFB laser of the Examples. At first, the DFB laser of the Examples is of a structure in which the well layers and the barrier layers of the active layer 24 are doped with an S atom being an n-type impurity uniformly. In Examples 1, Example 1-1 is of a structure in which an impurity density is low and Example 1-2 is of a structure in which an impurity density is high. An impurity density of Example 2 was made equal to that of Example 1-1. On the other hand, unlike the active layer 24 of Example 1-1, the active layers of the DFB laser of Comparison Example are not doped with an n-type impurity.

The DFB laser of the Examples and the DFB laser of the Comparison Example differ structurally in SCH layers formed across the active layer 24. Three steps of SCH structure are formed at an n-side and a p-side of the DFB laser of the Comparison Example. By contrast, in the DFB laser of the Examples, three steps of the SCH structure are formed at an n-side and seven steps of the SCH structure are formed at a p-side.

In the Examples, the n-side's SCH structure, that is, the n-side SCH layer 23 is configured by the three steps of the InGaAsP bulk of which composition wavelengths are 1.15 µm, 1.2 µm, and 1.25 µm, and the total thickness thereof is 30 nm. On the other hand, the p-side's SCH structure, that is, the p-type SCH layer 25 is configured by the seven steps of the InGaAsP bulk of which composition wavelengths are 1.00 µm, 1.05 µm, 1.10 µm, 1.15 µm, 1.20 µm, and 1.25 µm, and the total thickness is 61 nm. On the other hand, in the Comparison Example, the p-side's SCH structure is configured by three steps of the InGaAsP bulk of which composition wavelengths are 1.15 µm, 1.2 µm, and 1.25 µm, and the total thickness is 30 nm.

In the Comparison Example and the Example 1, the well layers of the active layer are of six layers in number, and the Comparison Example and the Example 1 were of structures having similar optical confinement coefficients. By contrast, in the Example 2, the number of well was reduced to five layers to be of a structure in which an optical confinement coefficient is smaller than those of the Comparison Example and the Example 1.

In the structures of the Comparison Example and the Example, elements were designed so that a ratio of far-field patterns in the vertical direction and the horizontal direction becomes substantially constant so that a coupling efficiency for the optical fiber becomes an approximately same degree.

In the structures of the Comparison Example and the Example, in order to adjust a coupling coefficient κ of the DFB laser as explained later, thicknesses of the grating layer and the InP spacer layer of the DFB laser were adjusted by the respective structures.

Figure 6:
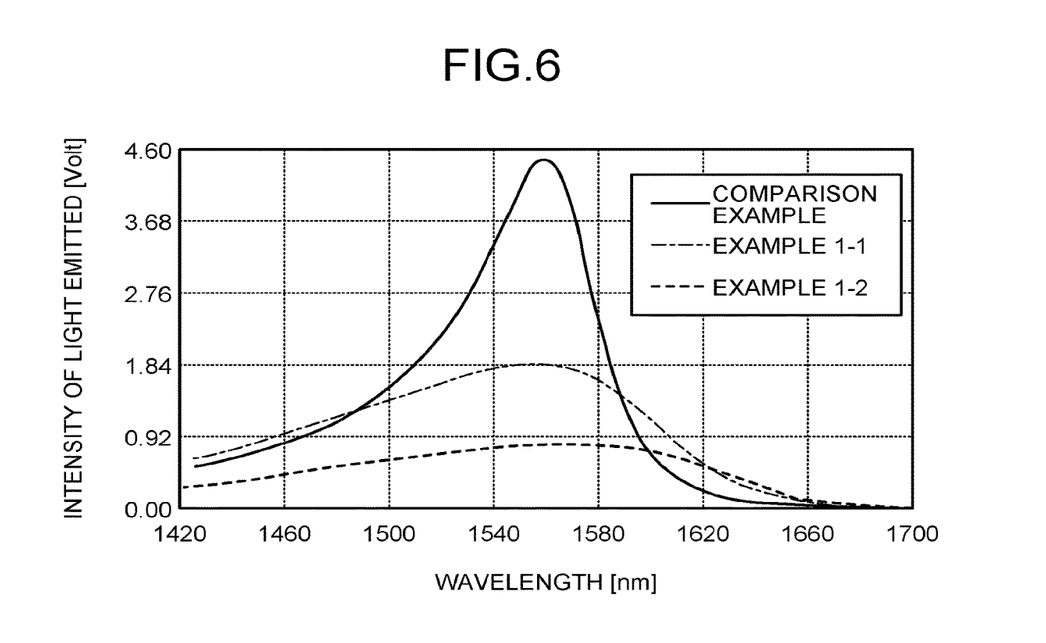
FIG. 6 is a view showing PL illumination spectra in semiconductor laser elements of Comparison Example, Example 1-1, and Example 1-2.

Then the semiconductor laser elements 100 according to the Comparison Example and the Example using the above-described DFB laser were evaluated. FIG. 6 is a view showing a PL illumination spectrum in the semiconductor laser elements according to the Comparison Example, the Example 1-1, and the Example 1-2. It is understood from FIG. 6 that the PL illumination spectra are less intensive and bandwidths of the PL illumination spectra are broader in the Example 1-1 and the Example 1-2 in comparison to the Comparison Example. Hereby, the semiconductor laser elements 100 according to the Example 1-1 and the Example 1-2 obtains an effect capable of reducing variation in characteristics of the DFB laser oscillating at different wavelengths since an influence by detuning defined by a difference between oscillation wavelength and gain peak is few.

TABLE 2

|  | Comparison example | Example 1-1 | Example 1-2 |
|---|---|---|---|
| Full width at half maximum (nm) | 61.7 | 151.2 | 178.8 |
| Full width at half maximum (meV) | 31.8 | 80.1 | 95.9 |

Table 2 is a view showing a full width at half maximum of the PL illumination spectrum of FIG. 6. As shown in Table 2, it is understood that full widths at half maximum expanded in the Example 1-1 and the Example 1-2 by equal to or greater than double that of the Comparison Example. This is because the active layers 24 of the Examples 1 are doped with an n-type impurity concentration. As shown in Table 2, it is understood that, the full width at half maximum expanded from 151.2 nm in the Example 1-1 to 178.8 nm in the Example 1-2. This is caused because the n-type impurity concentration with which the active layer 24 is doped is doubled. That is, there is an effect capable of controlling a full width and full width at half maximum of the PL illumination spectrum by controlling the concentration of the n-type impurity of the active layer 24.

Figure 7:
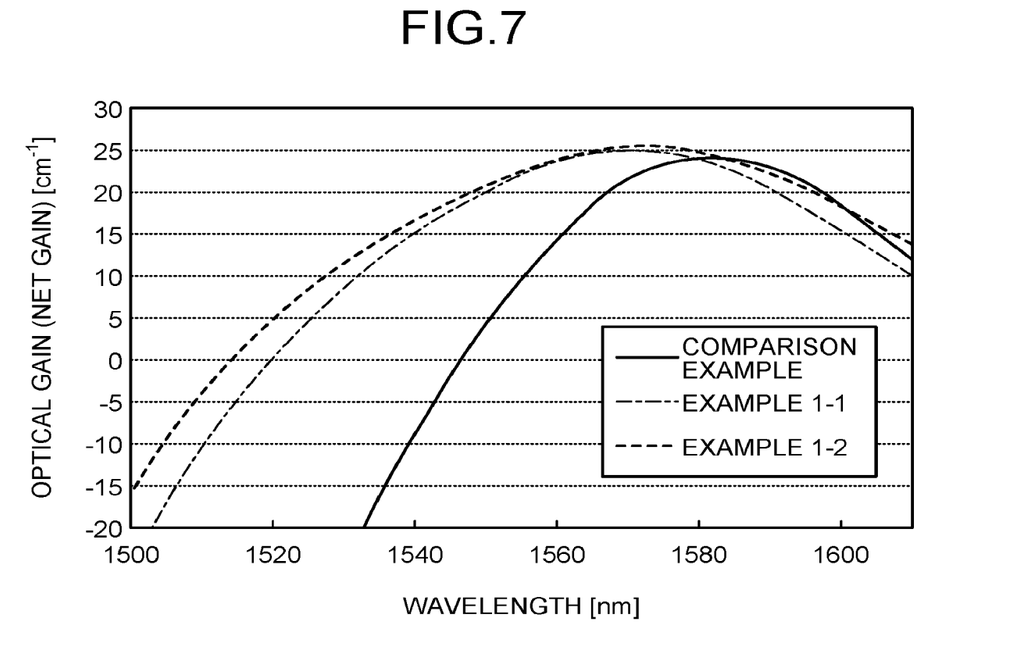
FIG. 7 is a view showing relationships between wavelengths and optical gains in the semiconductor laser elements of Comparison Example, Example 1-1, and Example 1-2.

FIG. 7 is a view showing a relationship between wavelength and optical gain in the semiconductor laser elements according to the Comparison Example, the Example 1-1, and the Example 1-2. It is understood from FIG. 7 that optical gains at wide bandwidths are great in the Example 1-1 and the Example 1-2 in comparison to that of the Comparison Example. This is because the active layer 24 of the DFB laser in the Example 1 is doped with the n-type impurity. If the active layer 24 is doped with the n-type impurity, the number of carrier increases in the active layer 24, and thus the active layer 24 will be in a state vulnerable to inverted distribution. Since a transition from a higher order level occurs in this state, optical gain increases at a wide bandwidth. That is, it was shown that a DFB laser being high in the intensity of a light outputted at a wide bandwidth could be achieved by the structure of Example 1 in which the active layer 24 was doped with the n-type impurity. Therefore, the semiconductor laser array 1 using this DFB laser, the semiconductor laser element 100, the semiconductor laser module 150, and the wavelength-variable laser assembly 200 are devices capable of outputting a highly intense laser light at a wide bandwidth.

Figure 8:
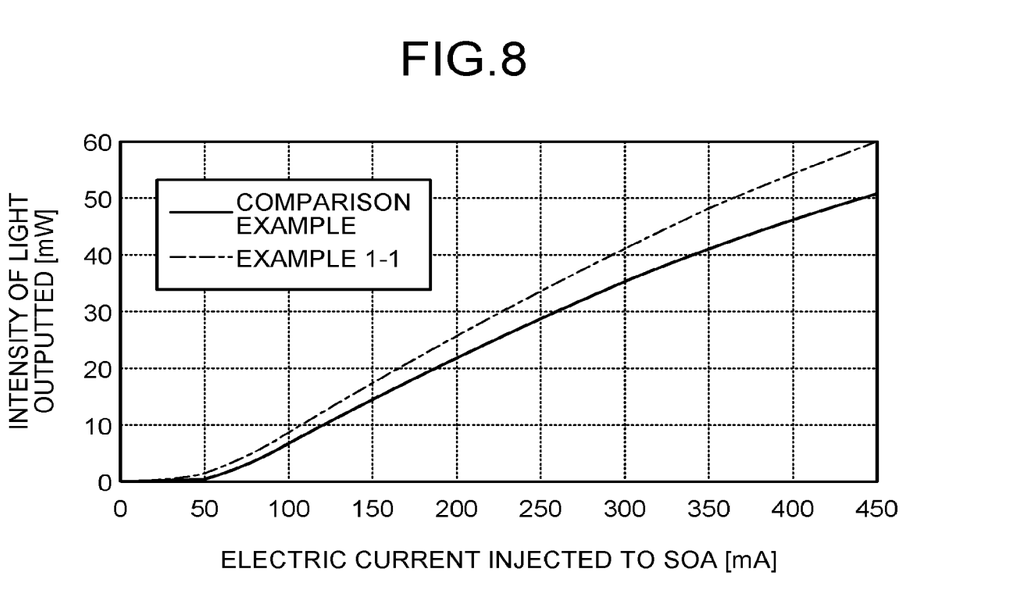
FIG. 8 is a view showing optical output characteristics of semiconductor laser modules in each of which output layer lights of the semiconductor laser elements of Comparison Example and Example 1-1 is coupled to an optical fiber via a lens system.

Moreover, each optical device according to the Examples has advantageous characteristics which will be explained as follows. FIG. 8 is a view showing optical output characteristics of semiconductor laser modules of which optical fibers are coupled with laser lights being outputted from the semiconductor laser elements of the Comparison Example and the Example 1-1 via lens systems. Measurements of FIG. 8 were conducted by setting a driving temperature of the semiconductor laser element 100 at 65° C., making a driving current of the DFB laser be fixed, and sweeping an applied electric current of the SOA 4.

As shown in FIG. 8, it was shown that an output operation of, approximately 15% higher than that of the Comparison Example may be achieved in the Example 1-1. The driving current of the SOA 4 for obtaining an optical output of 50 mW from the semiconductor laser module 150 is approximately 360 mA in the Example 1-1 in comparison to approximately 440 mA in the Comparison Example. That is, it was shown that the Example 1-1 achieved the semiconductor laser element and the semiconductor laser module of which power consumptions were lower by approximately 80 mA.

In the Example 1-1 and the Comparison Example, linewidths were measured when outputs from the optical fibers of the semiconductor laser modules were 22.4 mW. It was shown that the linewidth of the Example 1-1 was 410 kHz being lower than that of the Comparison Example by approximately 90 kHz, and thus it was capable of achieving the semiconductor laser element and the semiconductor laser module being narrower in linewidths. This is because an optical feedback from the SOA 4 to a DFB laser array area decreased since the driving current of the SOA 4 decreased more in the Example 1-1 than in the Comparison Example.

In a case of producing the semiconductor laser module 150 by using this semiconductor laser element 100, an approximately 1 dB of coupling loss is assumed for coupling the optical power from the semiconductor laser element 100 to the optical fiber 113. In this state, if the intensity of a light outputted from the semiconductor laser element 100 is equal to or greater than 50 mW, it is possible to cause the intensity of a light outputted from the semiconductor laser module 150 to be at equal to or greater than approximately 40 mA. Hereby it is possible to achieve the semiconductor laser module having a preferable intensity of a light outputted to be applied to a signal light source for use in the above-described digital coherent transmission.

Although down-sizing will be required hereafter for the wavelength-variable laser assembly 200 in which the semiconductor laser module 150 is implemented to the driving circuit, reduction in power consumption in this state of the semiconductor laser element 100 is an important object. Since the semiconductor laser element 100 according to the Example 1-1 is low in power consumption, thereby it is an element preferable for use in a small size integrable tunable laser assembly (ITLA).

Figure 9:
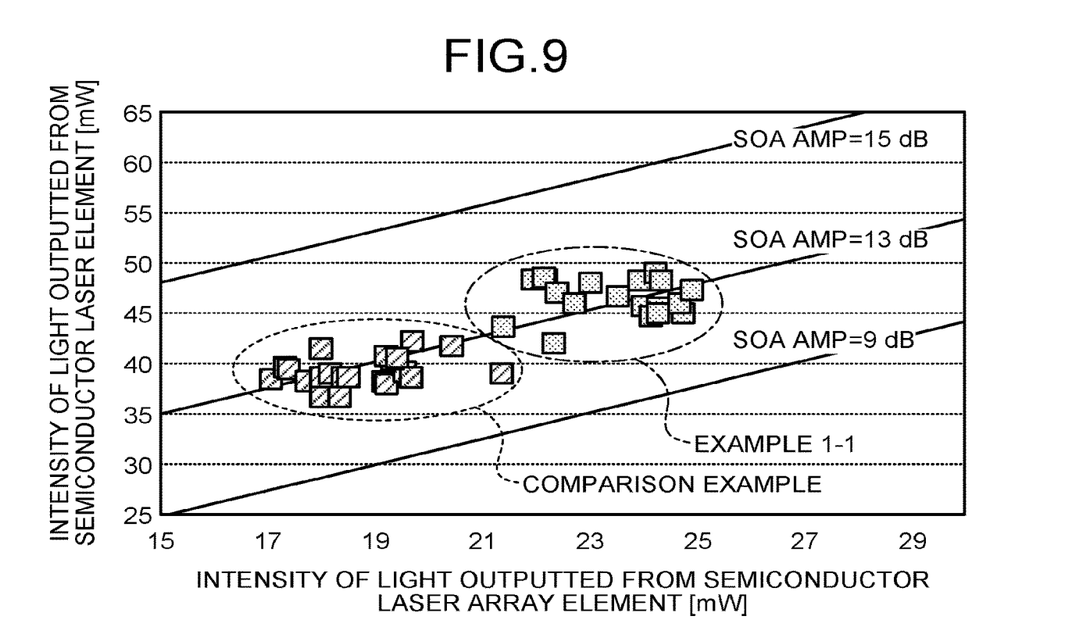
FIG. 9 is a view showing relationships between optical powers of the semiconductor laser array elements and optical powers of the semiconductor laser elements in Comparison Example and Example 1-1.

FIG. 9 is a view showing relationships between optical powers of the semiconductor laser array elements and optical powers of the semiconductor laser elements in the Comparison Example and the Example 1-1. In FIG. 9, the driving temperature of the semiconductor laser element 100 was set at 31° C., the injection current to the DFB laser was set at 150 mA, and the injection current to the SOA 4 was set at 175 mA.

In comparison of the Comparison Example and the Example 1-1, results were obtained that an output from the semiconductor laser array 1 was higher in the Example 1-1 than in the Comparison Example, and an output from the semiconductor laser element 100 as well was higher in the Example 1-1 than in the Comparison Example. Since an amplification ratio of the SOA 4 is approximately constant at 13 dB regardless of its structure, it is understood that higher output of the semiconductor laser element 100 was achieved by higher output of the semiconductor laser array 1.

Figure 10:
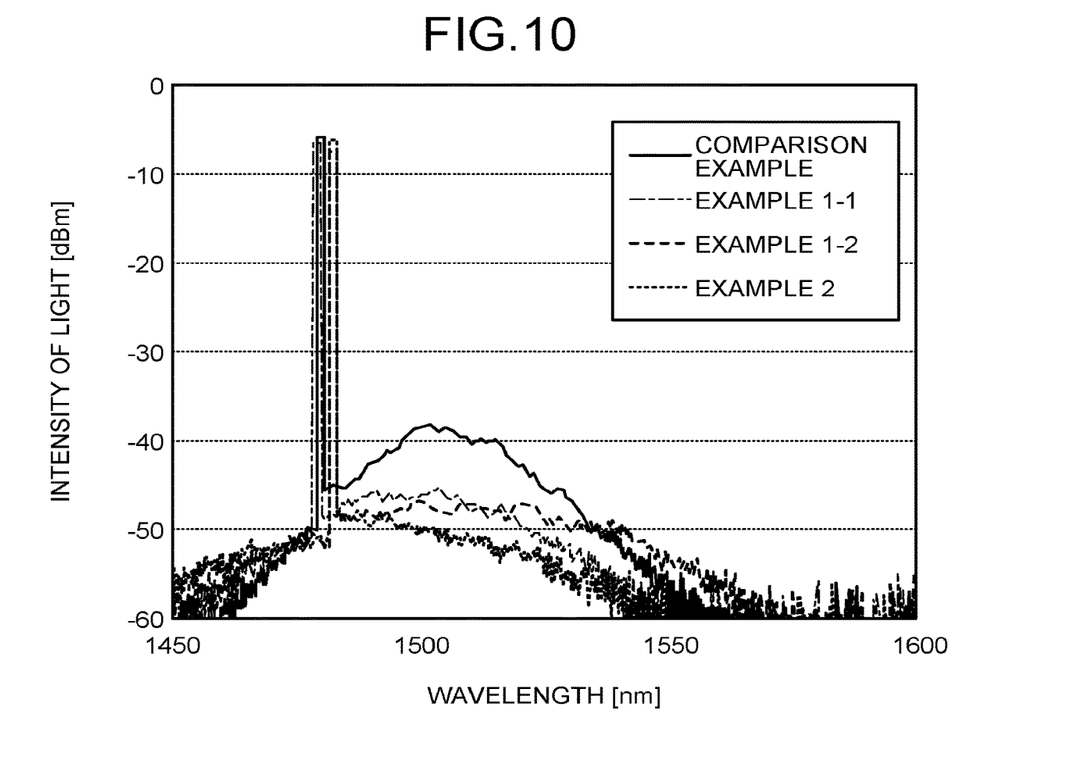
FIG. 10 is a view showing laser oscillation spectra of the semiconductor laser elements of Comparison Example, Example 1-1, Example 1-2, and Example 2 when being driven by a same optical power.

FIG. 10 is a view showing laser oscillation spectra when driving the semiconductor laser element according to the Comparison Example, the Example 1-1, the Example 1-2, and the Example 2 at the same optical power. It is understood from FIG. 10 that an ASE component of the SOA 4 is lower in the Examples than in the Comparison Example. That is, a signal-to-spontaneous emission ratio (SSER) improves in the Examples. This is because the driving current of the SOA 4 decreased since the output of the semiconductor laser array 1 of the Examples increased.

In comparison of the Example 1-1 and the Example 1-2, a peak intensity of the ASE component of the SOA 4 is reduced more in the Example 1-2 in which the active layer 24 is doped with a greater impurity density. In the Example 1-2, the full width at half maximum of the PL illumination spectrum is broader and an optical power under an identical driving condition is lower than those of the Example 1-1. Hereby it was shown that there is an effect capable of controlling an effect of restraining the ASE by adjusting a density of impurity with which the active layer 24 is doped.

In order to improve SSER, a smaller optical confinement coefficient is preferable. In the Example 2, since the well number of the active layer is fewer and the optical confinement coefficient is fewer, thus the ASE may be restrained and the SSER is improved.

Meanwhile, as described above, as a signal light source or a local light source for use in digital coherent transmission, a wavelength-variable laser capable of outputting a highly intense laser light in narrower linewidth is necessary. In order to achieve narrowed linewidth characteristics in the wavelength-variable laser, narrowing of linewidth of the semiconductor laser is common.

Herein, in the semiconductor laser array 1, the spectrum linewidth of the laser light outputted by the DFB laser being driven depends on, and varies according to, the cavity length Ldfb of each DFB laser and the coupling coefficient K of the diffraction grating. More specifically, it is possible to narrow the spectrum linewidth by extending the cavity length Ldfb and increasing the coupling coefficient $\kappa$.

However, when the cavity length Ldfb of each DFB laser is short, and when increasing and setting the coupling coefficient κ for obtaining narrowed linewidth characteristics, a side-mode suppression ratio (SMSR) is deteriorated, and thus a possibility of single mode oscillation decreases. Therefore, a product yield for the semiconductor laser array 1 decreases, and that results in an increase in cost.

On the other hand, when the cavity length of each DFB laser is long, a current-to-light conversion efficiency (W/A) decreases. That may cause, in some cases, an increase in the driving current of the DFB laser for achieving a desirable spectrum linewidth and an increase in power consumption.

Therefore, although it is preferable that κLdfb of each DFB laser be approximately 1.5, it is preferable that the κLdfb be, for example, equal to or greater than 1.3 and equal to or smaller than 1.7 μm in order to achieve both an excellent single mode oscillation characteristics and narrowed linewidth characteristics.

Herein, in order to maintain excellent single mode oscillation characteristics, Ldfb≥1200 μm is preferable. A greater cavity length Ldfb is preferable from a viewpoint that the spectrum linewidth hardly increases even if the amplification ratio of the SOA 4 increases in the case of greater cavity length Ldfb. In a case of, for example, κLdfb=1.5 and even if the cavity length Ldfb is extended longer than Ldfb>1500 μm, an effect of reducing the spectrum linewidth may not be obtained any more. From the viewpoint as such, by setting the Ldfb be ≤1500 μm, the desirable spectrum linewidth may be obtained without increasing the area of the semiconductor laser element 100 unnecessarily. Hereby the quantity of the semiconductor laser elements 100 obtainable from one piece of wafer may be increased, and thus, production cost may be decreased.

When a long cavity length Ldfb causes a problem in current-to-light conversion efficiency, an electric current density of an electric current being injected to the active layer 24 is increased by narrowing the mesa width of each DFB laser (or width of the active layer 24), and thus it is possible to restrain the current-to-light conversion efficiency from being reduced. Therefore, it is preferable that the width of the active layer 24 be, for example, equal to or smaller than 1.7 μm. Narrowing of the width of the active layer 24 is preferable not only for obtaining narrower linewidth of the laser light but also improving SMSR since the coupling coefficient κ decreases. However, since an electric resistance of each DFB laser increases if the width of the active layer 24 is narrowed too much, element characteristics may be deteriorated some times by heat produced. In order to prevent this, it is preferable that the width of the active layer 24 be equal to or greater than 1.4 μm.

The DFB lasers according to present Embodiment and Comparison Example use grating layers configured by InGaAsP. In this state, if the grating layer is thicker, or if the InP spacer layer is thinner, the coupling coefficient κ of the DFB laser tends to increase. As shown in Table 1, the InP spacer layer of Example 1 is thin and the grating layer is thick in comparison to those of Comparison Example. When comparing products κLdfb obtained by multiplying a designed value of the coupling coefficient κ by the cavity length Ldfb of the DFB laser, κLdfb was equal to 1.3 in Comparison Example, and by contrast, κLdfb was equal to 1.7 in Example 1. As described above, the κLdfb increases by varying structures of the InP spacer layer and the grating layer. A designed value of a coupling coefficient κ of Example 2 was equal to 1.7. Although Example 2 is of a structure in which the number of the well layers of the active layer 24 is fewer by one layer than that of Example 1, it is considered that an electric field distribution of light differ not so much in expansion that may cause κLdfb to vary. As described above, the desirable coupling coefficient κ is obtained by adjusting the thicknesses of the InP spacer layer and the grating layer.

As described above, the semiconductor laser array according to the present disclosure using the DFB laser being narrower in linewidth, the semiconductor laser element, the semiconductor laser module, and the wavelength-variable laser assembly are suitable for use in a signal light source or a local light source for use in digital coherent transmission.

Since an insertion loss to an Si waveguide is equal to or greater than 10 dB in an Si photonics array light source, a light source capable of higher output is required. Since, as a single laser array as well, the above-described DFB laser is capable of a high output operation, it is effective as a technology achieving a small size Si photonics array light source.

The above-described embodiment embodiments do not limit the present disclosure. The present disclosure includes a configuration appropriately combining the above-described elements. Further effects or modification examples may be derived by an ordinary skilled person in the art easily. Although, for example, InGaAsP-based materials were explained in the above-described embodiment, the present disclosure is applicable to other material system by doping the active layer with an n-type impurity. Therefore, further wide aspects of the present disclosure are not limited to the specific, detailed, and various modifications may be made.

As described above, the semiconductor laser array, the semiconductor laser array, the semiconductor laser module, and the wavelength-variable laser assembly according to the present disclosure are suitable for use in mainly in optical communication.

According to the present disclosure, it is possible to achieve a semiconductor laser array capable of outputting a highly intense laser light at a wide bandwidth, a semiconductor laser element, a semiconductor laser module, and a wavelength-variable laser assembly.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical amplifier comprising:
    an active layer including a multi-quantum well structure including a plurality of well layers and a plurality of barrier layers laminated alternately, wherein the active layer is doped with an n-type impurity, wherein a doping concentration of the n-type impurity is $1\times10^{17}$ cm$^{-3}$ or more and $1.2\times10^{18}$ cm$^{-3}$ or less, and wherein the active layer is surrounded by indium phosphate (InP); and
    an n-side separate confinement heterostructure layer and a p-side separate confinement heterostructure layer configured to sandwich the active layer therebetween in a thickness direction, wherein band gap energies of the n-side separate confinement heterostructure layer and the p-side separate confinement heterostructure layer are greater than band gap energies of the barrier layers of the active layer and are asymmetric across the active layer, and wherein the p-side separate confinement heterostructure layer is thicker than the n-side separate confinement heterostructure layer, wherein at least one of the n-side separate confinement heterostructure layer and the p-side separate confinement heterostructure layer includes a plurality of layers, and a composition wavelength of at least one layer of the plurality of layers differs from a composition wavelength of at least another layer of the plurality of layers, wherein a full width at half maximum of an illumination spectrum of the active layer is 80.1 meV or higher and 95.9 meV or lower, wherein the semiconductor optical amplifier is driven without causing laser oscillation, wherein the n-side separate confinement heterostructure layer includes a first multi-stepped configuration of a first bulk material having a first plurality of composition wavelengths, and the p-side separate confinement heterostructure laver includes a second multi-stepped configuration of a second bulk material having a second plurality of composition wavelengths that are different from the first plurality of composition wavelengths, and wherein the first multi-stepped configuration includes two or three steps of a separate confinement heterostructure, and the second multi-stepped configuration includes six or seven steps of a separate confinement heterostructure.

2. The semiconductor optical amplifier according to claim 1, wherein the n-type impurity includes at least one of S, Se and Si.

3. The semiconductor optical amplifier according to claim 1, wherein the p-side separate confinement heterostructure layer is greater in thickness than the n-side separate confinement heterostructure layer, and the band gap energy of the p-side separate confinement heterostructure layer increases along with an increase in distance from the active layer.

4. The semiconductor optical amplifier according to claim 3, wherein the band gap energy of the p-side separate confinement heterostructure layer increases linearly along with the increase in distance from the active layer.

5. The semiconductor optical amplifier according to claim 1, further including a semiconductor laser, wherein a cavity length of the semiconductor laser is equal to or greater than 1200 μm.

6. The semiconductor optical amplifier according to claim 1, further comprising a plurality of semiconductor lasers, wherein each one of the plurality of semiconductor lasers has a diffraction grating having a period corresponding to each oscillation wavelength.

7. The semiconductor optical amplifier according to claim 6, wherein a product of a coupling coefficient of the diffraction grating of each one of the semiconductor lasers multiplied by the cavity length of each corresponding one of the plurality of semiconductor lasers is 1.3 to 1.7.

8. The semiconductor optical amplifier according to claim 1, further comprising:

an input port configured to receive an oscillated laser light from an optical coupler, wherein the oscillated laser light is oscillated by a semiconductor laser array having a plurality of distributed feedback lasers; and an output port configured to output an amplified laser light based on the oscillated laser light without causing the laser oscillation.

9. A semiconductor optical element comprising:

an optical coupler configured to multiplex laser lights outputted from a plurality of semiconductor lasers; and a semiconductor optical amplifier configured to amplify a light outputted from the optical coupler, wherein the semiconductor optical amplifier includes:

an active layer including a multi-quantum well structure including a plurality of well layers and a plurality of barrier layers laminated alternately, wherein the active layer is doped with an n-type impurity, wherein a doping concentration of the n-type impurity is $1\times10^{17}$ cm$^{-3}$ or more and $1.2\times10^{18}$ cm$^{-3}$ or less, and wherein the active layer is surrounded by indium phosphate (InP); and a n-side separate confinement heterostructure layer and a p-side separate confinement heterostructure layer configured to sandwich the active layer therebetween in a thickness direction, wherein band gap energies of the n-side separate confinement heterostructure layer and the p-side separate confinement heterostructure layer are greater than band gap energies of the plurality of barrier layers of the active layer and are asymmetric across the active layer, and wherein the p-side separate confinement heterostructure layer is thicker than the n-side separate confinement heterostructure layer, wherein at least one of the n-side separate confinement heterostructure layer and the p-side separate confinement heterostructure layer includes a plurality of layers, and a composition wavelength of at least one layer of the plurality of layers differs from a composition wavelength of at least another layer of the plurality of layers, wherein a full width at half maximum of an illumination spectrum of the semiconductor optical amplifier is 80.1 meV or higher and 95.9 meV or lower, wherein the semiconductor optical amplifier is driven without causing laser oscillation, wherein the semiconductor optical element is configured to switch an operating semiconductor laser among the plurality of the semiconductor lasers, and to vary a wavelength of the laser light outputted from the semiconductor laser based on change in a temperature of the semiconductor laser, wherein the n-side separate confinement heterostructure layer includes a first multi-stepped configuration of a first bulk material having a first plurality of composition wavelengths, and the p-side separate confinement heterostructure layer includes a second multi-stepped configuration of a second bulk material having a second plurality of composition wavelengths that are different from the first plurality of composition wavelengths, and wherein the first multi-stepped configuration includes two or three steps of a separate confinement heterostructure, and the second multi-stepped configuration includes six or seven steps of a separate confinement heterostructure.

10. A semiconductor laser module comprising:

a semiconductor optical element including:

an optical coupler configured to multiplex laser lights outputted from a plurality of semiconductor lasers; and a semiconductor optical amplifier configured to amplify a light outputted from the optical coupler, wherein the semiconductor optical amplifier includes:

an active layer including a multi-quantum well structure including a plurality of well layers and a plurality of barrier layers laminated alternately, wherein the active layer is doped with an n-type impurity, wherein a doping concentration of the n-type impurity is $1\times10^{17}$ cm$^{-3}$ or more and $1.2\times10^{18}$ cm$^{-3}$ or less, and wherein the active layer is surrounded by indium phosphate (InP); and a n-side separate confinement heterostructure layer and a p-side separate confinement heterostructure layer configured to sandwich the active layer therebetween in a thickness direction, wherein band gap energies of the n-side separate confinement heterostructure layer and the p-side separate confinement heterostructure layer are greater than band gap energies of the plurality of barrier layers of the active layer and are asymmetric across the active layer, and wherein the p-side separate confinement heterostructure layer is thicker than the n-side separate confinement heterostructure layer, wherein at least one of the n-side separate confinement heterostructure layer and the p-side separate confinement heterostructure layer includes a plurality of layers, and a composition wavelength of at least one layer of the plurality of layers differs from a composition wavelength of at least another layer of the plurality of layers, wherein a full width at half maximum of an illumination spectrum of the semiconductor optical amplifier is 80.1 meV or higher and 95.9 meV or lower, wherein the semiconductor optical amplifier is driven without causing laser oscillation, and wherein the semiconductor optical element is configured to switch an operating semiconductor laser among the plurality of the semiconductor lasers, and to vary a wavelength of the laser light outputted from the semiconductor laser based on change in a temperature of the semiconductor laser;

an optical fiber configured to emit a laser light outputted by the semiconductor optical element to outside;

an optical component configured to couple the laser light outputted by the semiconductor optical element to the optical fiber, wherein the n-side separate confinement heterostructure laver includes a first multi-stepped configuration of a first bulk material having a first plurality of composition wavelengths, and the p-side separate confinement heterostructure layer includes a second multi-stepped configuration of a second bulk material having a second plurality of composition wavelengths that are different from the first plurality of composition wavelengths, and wherein the first multi-stepped configuration includes two or three steps of a separate confinement heterostructure, and the second multi-stepped configuration includes six or seven steps of a separate confinement heterostructure.

11. A wavelength-tunable laser assembly comprising:
a semiconductor laser module; and
an electronic substrate configured to drive and control the semiconductor laser module mounted on the electronic substrate,
wherein the semiconductor laser module includes:
a semiconductor optical element including:
an optical coupler configured to multiplex laser lights outputted from a plurality of semiconductor lasers; and a semiconductor optical amplifier configured to amplify a light outputted from the optical coupler, wherein the semiconductor optical amplifier includes:
an active layer including a multi-quantum well structure including a plurality of well layers and a plurality of barrier layers laminated alternately, wherein the active layer is doped with an n-type impurity, wherein a doping concentration of the n-type impurity is $1\times10^{17}$ cm$^{-3}$ or more and $1.2\times10^{18}$ cm$^{-3}$ or less, and wherein the active layer is surrounded by InP; and a n-side separate confinement heterostructure layer and a p-side separate confinement heterostructure layer configured to sandwich the active layer therebetween in a thickness direction, wherein band gap energies of the n-side separate confinement heterostructure layer and the p-side separate confinement heterostructure layer are greater than band gap energies of the plurality of barrier layers of the active layer and are asymmetric across the active layer, and wherein the p-side separate confinement heterostructure layer is thicker than the n-side separate confinement heterostructure layer, wherein at least one of the n-side separate confinement heterostructure layer and the p-side separate confinement heterostructure layer includes a plurality of layers, and a composition wavelength of at least one layer of the plurality of layers differs from a composition wavelength of at least another layer of the plurality of layers, wherein a full width at half maximum of an illumination spectrum of the semiconductor optical amplifier is 80.1 meV or higher and 95.9 meV or lower, wherein the semiconductor optical amplifier is driven without causing laser oscillation, and wherein the semiconductor optical element is configured to switch an operating semiconductor laser among the plurality of the semiconductor lasers, and to vary a wavelength of the laser light outputted from the semiconductor laser based on change in a temperature of the semiconductor laser;

an optical fiber configured to emit a laser light outputted by the semiconductor optical element to outside; and an optical component configured to couple the laser light outputted by the semiconductor optical element to the optical fiber, wherein the n-side separate confinement heterostructure laver includes a first multi-stepped configuration of a first bulk material having a first plurality of composition wavelengths, and the p-side separate confinement heterostructure laver includes a second multi-stepped configuration of a second bulk material having a second plurality of composition wavelengths that are different from the first plurality of composition wavelengths, and wherein the first multi-stepped configuration includes two or three steps of a separate confinement heterostructure, and the second multi-stepped configuration includes six or seven steps of a separate confinement heterostructure.

* * * * *